US010930991B1

(12) United States Patent
McDonald et al.

(10) Patent No.: US 10,930,991 B1
(45) Date of Patent: Feb. 23, 2021

(54) METHOD AND/OR APPARATUS FOR FRICTIONLESS WIDEBAND HIGH-POWER RADIO-FREQUENCY POWER TRANSMISSION ACROSS A FREELY MOVING INTERFACE

(71) Applicant: The Government of the United States of America, as represented by the Secretary of the Navy, Arlington, VA (US)

(72) Inventors: Michael S. McDonald, Springfield, VA (US); Michael W. Nurnberger, Springfield, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 42 days.

(21) Appl. No.: 16/561,479

(22) Filed: Sep. 5, 2019

(51) Int. Cl.
*H01P 1/06* (2006.01)
*H01P 5/08* (2006.01)
(Continued)

(52) U.S. Cl.
CPC .............. *H01P 5/085* (2013.01); *H01P 1/047* (2013.01); *H01P 1/061* (2013.01); *H03H 7/38* (2013.01)

(58) Field of Classification Search
CPC .... H01P 1/06; H01P 1/061; H01P 1/04; H01P 1/047; H01P 1/045; H01P 5/085;
(Continued)

(56) References Cited

U.S. PATENT DOCUMENTS 2,644,028 A * 6/1953 Bernet .................... H01P 1/061
174/88 C
2,802,994 A * 8/1957 Ober ....................... H01P 1/061
333/256

(Continued)

OTHER PUBLICATIONS

Pollack et al., Long and Uniform Plasma Columns Generated by Linear Field-applicators Based on Stripline Technology, Plasma Sources Sci. Technol., 2007, pp. 310-323, vol. 10, No. 2, IOP Publishing, Bristol, UK.

(Continued)

*Primary Examiner* — Stephen E. Jones
(74) *Attorney, Agent, or Firm* — US Naval Research Laboratory; Suresh Kosby

(57) ABSTRACT

An apparatus includes a radio frequency ("RF") translational joint. The RF translational joint includes a first coaxial line. The RF translational joint includes a first constant impedance coaxial transition connected to the first initial coaxial line. The RF translational joint includes a coax-to-stripline transition. The RF translational joint includes a stripline section connected to the first constant impedance coaxial transition via the coax-to-stripline transition. The RF translational joint includes a stripline-to-coax transition. The RF translational joint includes a second constant impedance coaxial transition connected to the stripline section via the stripline-to-coax transition. The RF translation joint includes a second coaxial line connected to the second constant impedance coaxial transition.

13 Claims, 6 Drawing Sheets

(51) Int. Cl.
  *H01P 1/04* (2006.01)
  *H03H 7/38* (2006.01)
(58) Field of Classification Search
  CPC ...... H01P 5/08; H01P 5/00; H01P 5/02; H01P 5/04; H01R 9/22; H01R 9/226; H01R 12/727; H01R 12/89; H01R 13/26; H01R 13/28
  USPC .................... 333/33, 260, 34, 254, 256, 257
  See application file for complete search history.

(56) References Cited

U.S. PATENT DOCUMENTS

| | | | | |
|---|---|---|---|---|
| 4,675,633 | A | * | 6/1987 | Young ..................... H01P 1/061 285/302 |
| 5,341,116 | A | * | 8/1994 | Kerkhoff ................. H01P 1/061 174/88 C |
| 9,866,203 | B1 | * | 1/2018 | Tsironis .................... H03J 7/16 |
| 2015/0185425 | A1 | * | 7/2015 | Gundel ................... G02B 6/43 455/90.2 |

OTHER PUBLICATIONS

Bahl et al., A Designer's Guide to Stripline Circuits, Microwaves, Jan. 1978, pp. 90-96, vol. 17, [Publisher unknown]. [Publisher address unknown].

Barrett, Robert. Microwave Printed Circuits—The Early Years, IEEE Transactions on Microwave Theory and Techniques, Sep. 1984, pp. 983-990, vol. MTT-32, No. 9, IEEE, Piscataway, NJ, USA.

* cited by examiner

METHOD AND/OR APPARATUS FOR FRICTIONLESS WIDEBAND HIGH-POWER RADIO-FREQUENCY POWER TRANSMISSION ACROSS A FREELY MOVING INTERFACE

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004. Washington, D.C. 20375, USA; +1.202.767.7230; techtran@nrl.navy.mil, referencing NC 108858-US2.

CROSS-REFERENCE TO RELATED APPLICATIONS

This Application claims the benefit of U.S. Provisional Application Ser. No. 62/727,137 filed on 5 Sep. 2018, the entirety of which is incorporated herein by reference.

BACKGROUND OF THE INVENTION

Field of the Invention

This invention relates in general to a method and/or apparatus for power transmission coupling, and in particular to a method/or apparatus for noncontacting power transmission coupling, for example, for use in spacecraft propulsion development.

Description of the Related Art

Large chemical rocket systems are typically performance tested on static fire thrust stands and evaluated based on simple load cell readings. Their generated forces are so large compared to their weight and size that there is no signal to noise issue. By contrast, conventional spacecraft electric propulsion systems such as standard Hall thrusters and standard gridded ion thrusters are typically tested at vacuum on either a standard inverted pendulum thrust stand, for thrusts greater than about 1-10 mN, or on a standard torsional thrust stand for smaller thrusts down to the single micronewton range. Both conventional stands rely on either measuring displacement of the thruster in a direction normal to gravity or else on measuring the restoring force required to prevent displacement in order to accurately measure thrust forces in the micro- to milli-newton range generated by devices weighing from tens to hundreds of newtons. Conventional power cabling for these thruster stands typically heats up during testing, causing the cables to thermally expand and "push" on the thruster, appearing as a false thrust. Also, the heating changes the stiffness of the conventional power cable, affecting the restoring force against which the thrust stand sensitivity is calibrated.

For the inverted pendulum thrust stand, a thruster is placed on top of a platform supported by several thin flexures of sufficient strength in the vertical direction of gravity to support the thruster weight but sufficiently weak in the horizontal direction to permit lateral oscillation in response to a horizontal force. Electrical cabling for device thrusting power, instrumentation and any assorted electromagnets or other features is typically routed through a "waterfall" hanging from above the device and gently draping down to the thruster to ensure that the slack cabling can absorb any thermal expansion with minimal force exerted on the thruster. Typical accuracies of +/−1 mN are quoted in inverted pendulum thrust stands.

For the torsional thrust stand, a thruster is placed on one end of a torsion arm mounted on a very low stiffness or freely swinging central axis. This central axis may either be composed of torsional pivot joints, which are metal cylinders with crossed internal leaves of metal making only a thin joint that provides high vertical load strength with very low torsional stiffness, or else a thin solid wire or beam. In all such cases, the thruster load must be balanced by an equal countermass on the opposite end of the arm. Electrical cabling to the thruster passes vertically from the stationary stand base to the freely rotating arm as near the axis as practical, and the wires are clamped in place to minimize wire shifting so that the cabling provides a relatively fixed additional torsional stiffness to the system. Typical accuracies of order+/−1-10 uN are quoted in torsional thrust stands.

These techniques for cable routing either in an inverted pendulum's waterfall or on a torsional stand's axis with clamps work reasonably well for direct current and low-frequency alternative current power transfer applications, where relatively flexible and small diameter stranded wires can be used to transfer power with minimal power loss in the wire or effects on the thrust reading of the device under test. However, several classes of modern spacecraft electric propulsion use much higher frequency power in the megahertz to gigahertz (MHz-GHz) range, hereafter referred to in this patent application as radio frequency ("RF") power, where cabling is typically much stiffer and more lossy. Low-loss cables are typically larger in diameter, increasing the stiffness, so optimizing both features in a single implementation is not possible. As a result, RF power transmission onto thrust stands is problematic and prone to inducing thermal errors much larger than the inherent accuracy limits of the typical thrust stand solutions.

One solution is to accept these errors and the resulting increased thermal drift and loss of measurement accuracy when dealing with RF power. Another solution is to send only DC power to the thrust stand, and to perform DC-RF power conversion and amplification directly on the thrust stand, isolating the cabling thermal expansion from the measurement axis. Because power conversion and amplification are not perfectly efficient, this increases the overall thermal load to the thrust stand. Because small force measurement on thrust stands typically takes place in vacuum, this also requires vacuum-compatible power electronics capable of managing this thermal load purely through conduction and radiation, with no natural or forced air convection cooling available.

Additionally, conventional RF joints that accommodate any sort of internal relative motion provide either rotational motion around a common (i.e., coaxial) axis, like a rotary joint, or translation in a plane, like two parallel waveguide flanges. However, a conventional rotary joint that is implemented to be non-contacting is very complex mechanically and also relatively narrow-band. It must be mounted so that the motion is either along its axis (i.e., providing only very small amounts of translation), or around its axis (i.e., rotational), requiring it to be mounted coaxially with the thrust stand. A conventional waveguide joint can provide significant motion in a plane, but is inherently bandwidth-limited by the modal behavior of the waveguide and, in the 500 MHz to 2 GHz range, is nearly as large as the thrust stand and quite heavy.

BRIEF SUMMARY OF THE INVENTION

An embodiment of the invention includes a noncontacting power transmission coupling apparatus designed to transmit electrical power from a source to destination with no direct physical contact across a small gap. This feature is attractive for spacecraft propulsion development, where power from single watts to several kilowatts must be supplied to thrusters that produce small thrust forces in the micro- to milli-Newton range. An embodiment of the invention including a noncontacting RF translational joint to provide power to the thruster, an embodiment of the invention invention allows the thermal errors induced by the power cabling to be decoupled from the thruster device under test, improving the reliability of thrust readings especially at high power levels. An embodiment of the invention also moves the waste heat associated with RF power generation and amplification off the thrust stand, further reducing thrust stand thermal drift errors.

Illustrative features of one or more embodiments of the invention include one or more of the following:

1) the wideband nature of the power transmission for a given embodiment of the invention;
2) the high efficiency and low return loss of the joint owing to careful RF design that minimizes discontinuities and maintains a near-constant characteristic impedance;
3) the prevention of the occurrence of multipactor discharges in vacuum operation up to 500 W with at least 6 dB of margin over the frequency range of operation;
4) the presence of a clear degree of freedom for motion in the joint, to permit displacement of a thruster under test;
5) the good performance of the joint under slight misalignment in this degree of freedom; and
6) the high power throughput capability of the joint.

At least one embodiment of the invention:

1) allows significant planar motion (i.e., translation or rotation in a plane) of RF joint while maintaining good RF performance (low insertion loss and low reflection);
2) integrates well into rotation- or translation-based thrust stands, thereby not requiring on-axis mounting;
3) addresses requirements of a high-power RF system in a vacuum (e.g., multipactor requirements); and
4) allows much more wideband power transmission than possible with conventional solutions.

DETAILED DESCRIPTION OF THE INVENTION

Figure 1:
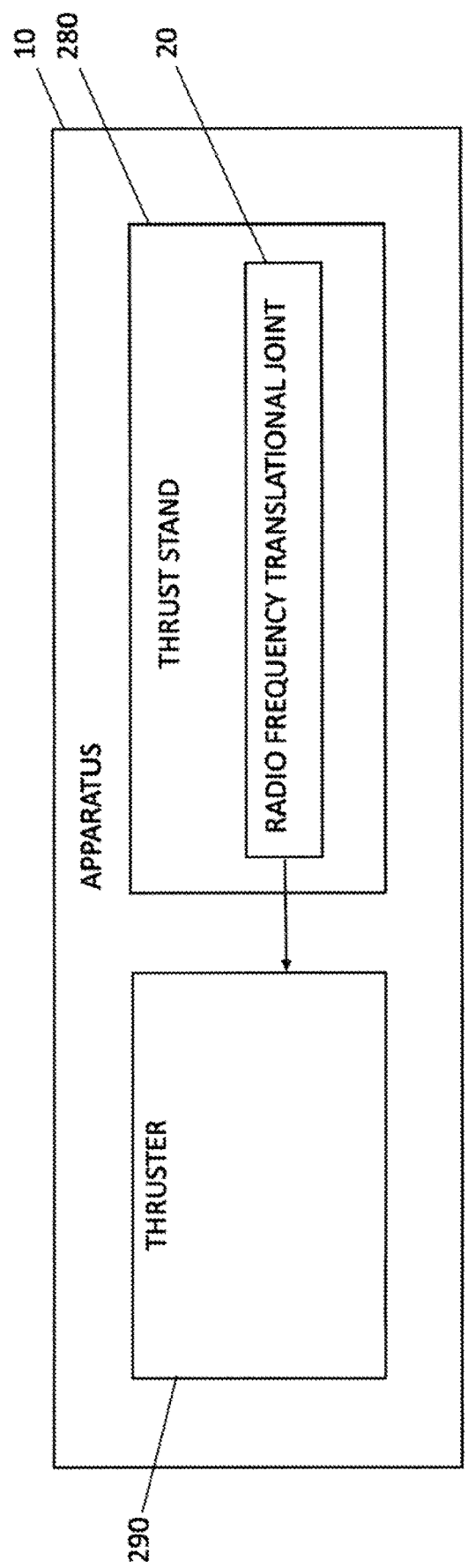
FIG. 1 is a block diagram of an embodiment of the instant invention.
Figure 2:
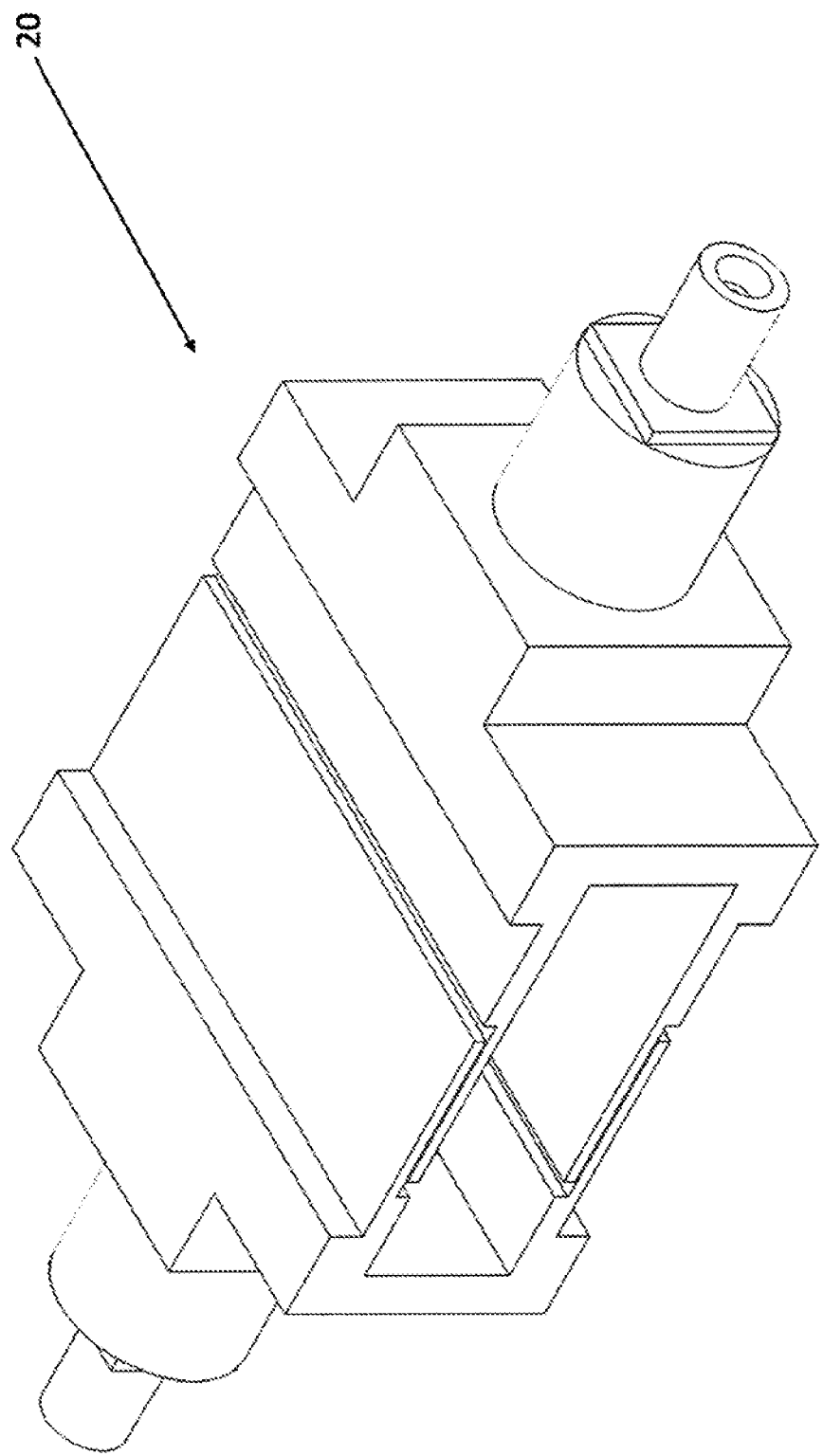
FIG. 2 is a perspective view of a RF translational joint according to an embodiment of the instant invention.
Figure 3:
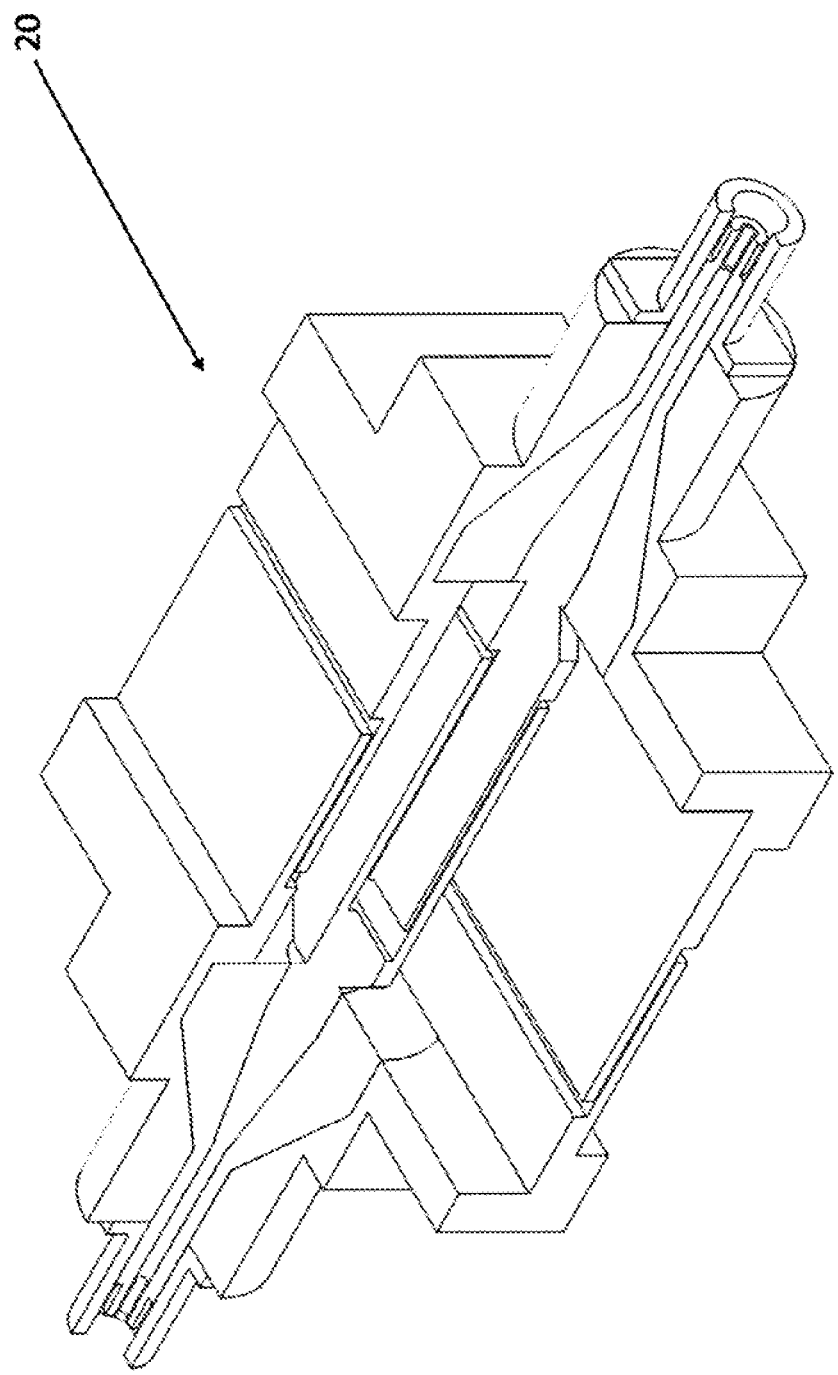
FIG. 3 is a three-quarter perspective view of a RF translational joint according to an embodiment of the instant invention.

An apparatus according to the instant invention is described as follows. The apparatus 10 includes a RF translational joint 20, as shown by way of example in FIGS. 1-4. The RF translational joint 20 includes a first coaxial line 30, as shown by way of example in FIG. 5. The RF translational joint 20 includes a first constant impedance coaxial transition 40 connected to the first initial coaxial line 30, as shown by way of example in FIG. 5. The RF translational joint 20 includes a coax-to-stripline transition 50, as shown by way of example in FIG. 5. The RF translational joint 20 includes a stripline section 60 connected to the first constant impedance coaxial transition 40 via the coax-to-stripline transition 50, as shown by way of example in FIG. 5. The RF translational joint 20 includes a stripline-to-coax transition 70, as shown by way of example in FIG. 5. The RF translational joint 20 includes a second constant impedance coaxial transition 80 connected to the stripline section 60 via the stripline-to-coax transition 70, as shown by way of example in FIG. 5. The RF translation joint 20 includes a second coaxial line 90 connected to the second constant impedance coaxial transition 80, as shown by way of example in FIG. 5.

Figure 4:
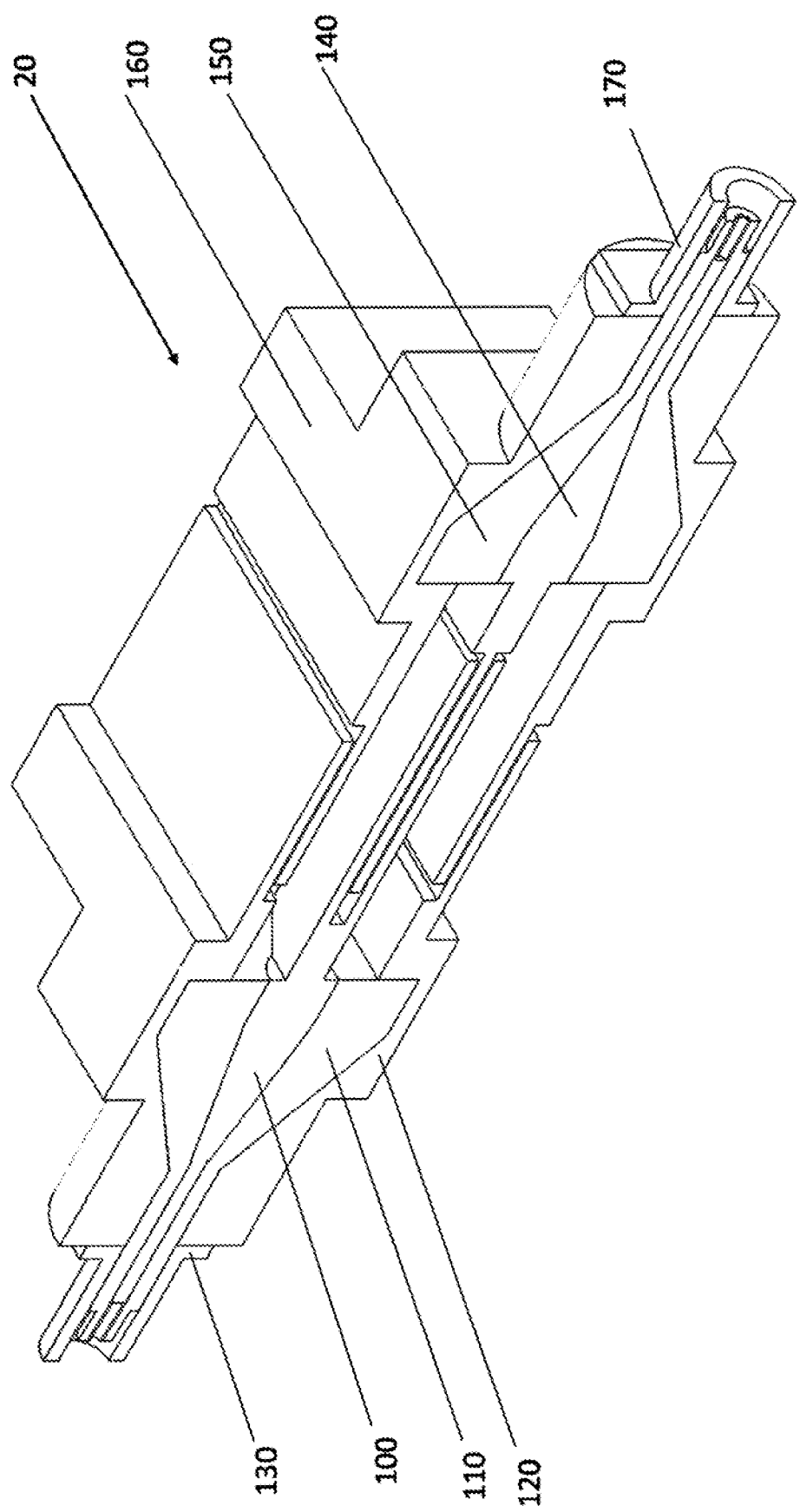
FIG. 4 is a half perspective view of a RF translational joint according to an embodiment of the instant invention.

Optionally, as shown by way of example in FIG. 4, the first initial coaxial line 30, the first constant impedance coaxial transition 40, and the stripline transition 60 together include a first center conductor 100, a first insulator 110 surrounding the first center conductor, and a first conducting joint body 120 surrounding the first insulator. For example, the first center conductor and the first conducting joint body is made of a standard conductor, such as copper and aluminum. For example, the first insulator is made of a standard insulator, such as standard plastic, standard polytetrafluoroethylene, standard nylon, or standard ceramic. Optionally, the first center conductor 100 widens in at least part of the first constant impedance coaxial transition 40, and the first insulator 110 widens in at least part of the first constant impedance coaxial transition. Optionally, the first initial coaxial line 30 includes a first coaxial connector 130 surrounding the first center conductor 100 and the first insulator 110. The first coaxial connector 130 abuts the first conducting joint body 120.

Optionally, as shown by way of example in FIG. 4, the stripline section 60, the second constant impedance coaxial transition 80, and the second initial coaxial line 90 together include a second center conductor 140, a second insulator 150 surrounding the second center conductor, and a second conducting joint body 160 surrounding the second insulator. Optionally, the second center conductor 140 widens in at least part of the second constant impedance coaxial transition 70, and the second insulator 150 widens in at least part of the second constant impedance coaxial transition. Optionally, the second initial coaxial line 90 includes a second coaxial connector 170 surrounding the second center conductor 140 and the second insulator 150. The second coaxial connector 170 abuts the second conducting joint body 160.

Figure 5:
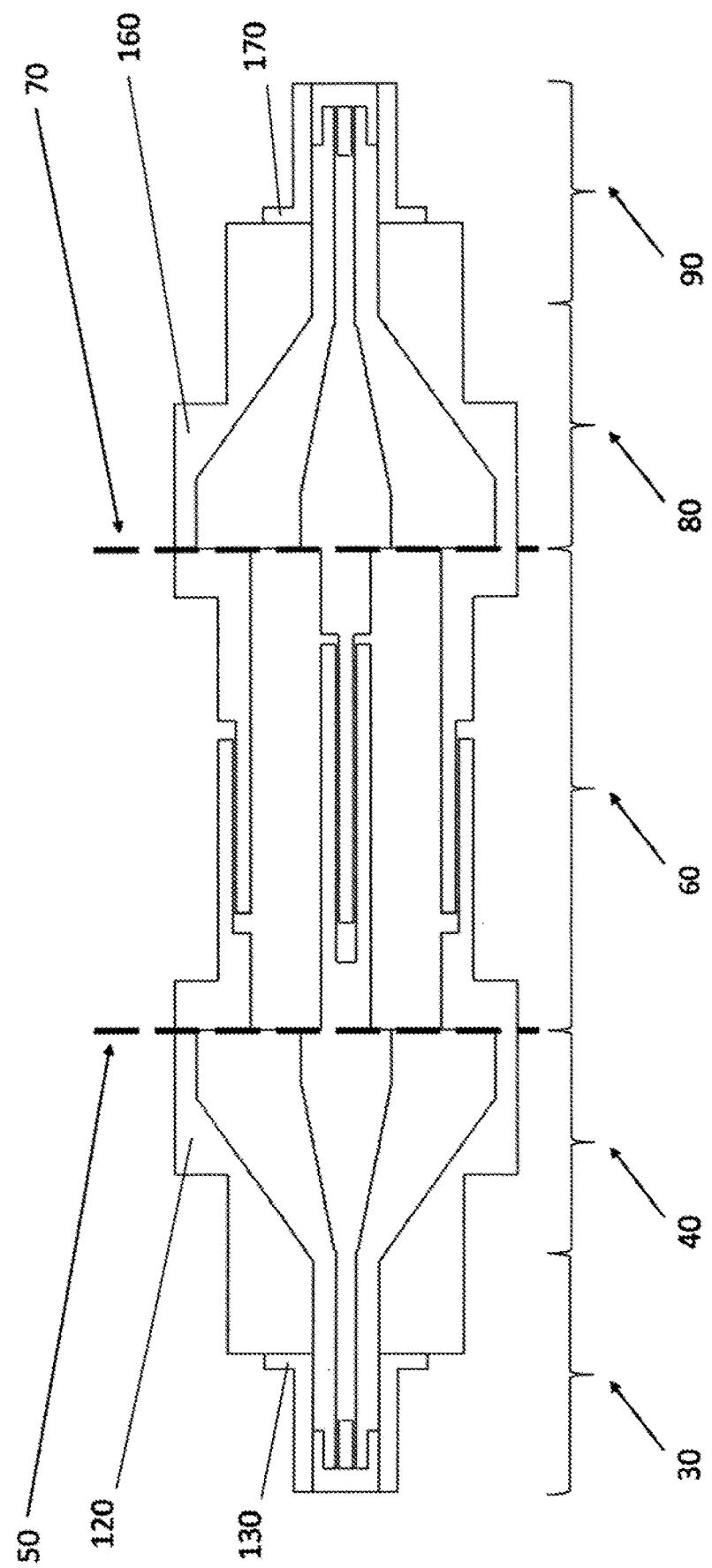
FIG. 5 is a side sectional view of a RF translational joint according to an embodiment of the instant invention.
Figure 6:
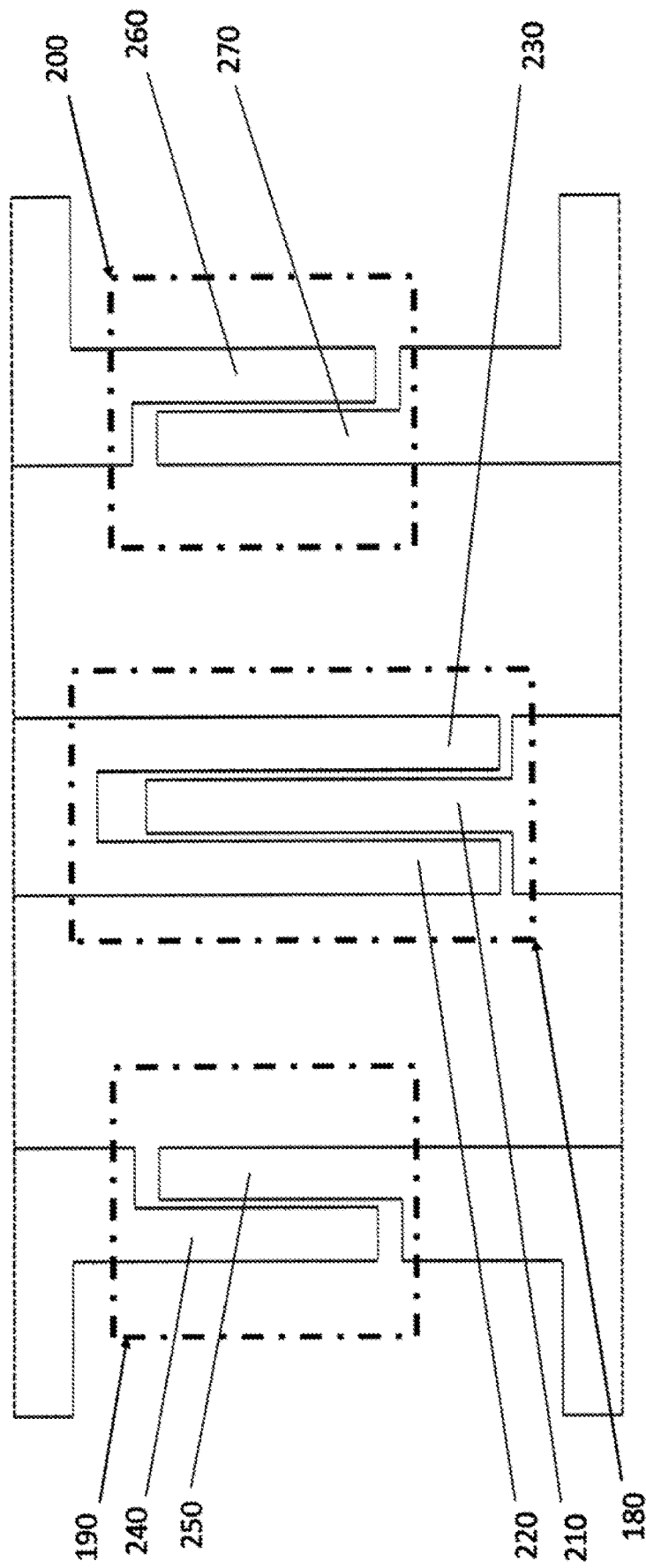
FIG. 6 is a magnified, side sectional view of a stripline section according to an embodiment of the instant invention shown in FIG. 5.

Optionally, as shown by way of example in FIGS. 5-6, the stripline section 60 includes an inner choke joint 180, a first outer choke joint 190, and a second outer choke joint 200. The first outer choke joint 190 and the second outer choke joint 200 are on respective sides of the inner choke joint 180. Optionally, the inner choke joint 180 includes a flat inner finger 210. The second center conductor 140 includes the flat inner finger 210, the flat inner finger being an end of the second center conductor, as shown for example, in FIGS. 4-6. The inner choke joint 180 includes a plurality of flat outer fingers 220, 230. The first center conductor 100 includes the plurality of flat outer fingers 220, 230, the flat outer fingers being ends of the first center conductor, as shown for example, in FIGS. 4-6. FIGS. 4-6 show one flat inner finger 210 and two flat outer fingers 220, 230 only for ease of understanding by the reader. One of ordinary skill in the art will readily appreciate that, depending on the application, alternative embodiments of the invention balance ease of manufacture with bandwidth requirements for the application. For example, an application weighting greater ease of manufacture over a wider bandwidth requirement warrants an inner choke joint having fewer fingers (e.g., an inner choke joint including one inner finger and two outer fingers). As another example, an application weighting a wider bandwidth requirement over greater ease of manufacture warrants an inner choke joint including N inner fingers alternately interleaving, or overlapping with, N+1 outer fingers, where N is greater than 1. For example, such an inner choke joint includes an even number of inner fingers (e.g., two inner fingers) alternately interleaving an odd number of outer fingers (e.g., three outer fingers). For example, such an inner choke joint includes an odd number of inner fingers (e.g., three inner fingers) alternately interleaving an even number of outer fingers (e.g., four outer fingers). The first center conductor 100 includes the plurality of flat outer fingers 220, 230.

Optionally, as shown by way of example in FIGS. 5-6, the first outer choke joint 190 includes a first outer plane 240. The first joint body 120 includes the first outer plane 240. The first outer choke joint 190 includes a first inner plane 250. The second joint body 160 includes the first inner plane 250.

Optionally, as shown by way of example in FIGS. 5-6, the second outer choke joint 200 includes a second outer plane 260. The first joint body 120 includes the second outer plane 260. The second outer choke joint 200 includes a second inner plane 270. The second joint body 160 includes the second inner plane 270.

One of ordinary skill in the art will readily appreciate that, in an alternative embodiment of the invention, the first joint body includes the first inner plane, the second joint body includes the first outer plane, the first joint body includes the second inner plane, and the second joint body includes the second outer plane.

One of ordinary skill in the art will readily appreciate that FIG. 6 shows outer choke joints 190, 200 including only one outer plane and one inner plane, respectively, for ease of understanding by the reader. One of ordinary skill in the art will readily appreciate that, depending on the application, an alternative embodiment of the invention includes outer choke joints 190, 200 including more than one outer plane and/or more than one inner plane. In such an alternative embodiment of the invention, the more than one outer plane and/or the more than one inner plane interleave.

Optionally, as shown by way of example in FIG. 1, the apparatus 10 further includes a standard thrust stand 280. The thrust stand 280 includes the RF translational joint 20. Optionally, the thrust stand includes a stationary side and a movable side. The first coaxial line 30 is located on the stationary side. The second coaxial line 90 is located on the movable side.

Optionally, as shown by way of example in FIG. 1, the apparatus 10 further includes a standard thruster 290 located on the thrust stand 280. The thruster 290 communicates with the RF translational joint 20. In operation, the thruster 290 receives power transmission via the RF translational joint 20.

Another embodiment of the invention is described as follows with reference to FIG. 1 and includes an apparatus 10 that couples RF power from a standard stationary thrust stand 280 (or equivalently termed thrust stand base) to a standard inverted pendulum or a standard torsional arm through a noncontacting RF translational joint 20. For the purpose of this patent application, the term "noncontacting" means having components free to move without friction in at least one degree of freedom. In operation, the RF translational joint 20 provides essentially frictionless power transmission with minimal heat transfer to a thruster 290 under test.

The noncontacting RF translational joint 20 includes three RF transmission line sections—a stripline section 60 and two identical, or mirror-image, RF transmission line sections, or constant impedance coaxial transitions 40, 80. The constant impedance coaxial transitions 40, 80 are located on either side of the stripline section 60, and are respectively located between coaxial transmission lines 30, 90 and the stripline section. The stripline section 60 provides translational motional freedom. The constant impedance coaxial transitions 40, 80 is where conversion to and from, for example, standard coaxial geometry, scaled to standard TNC connectors, is accomplished. Alternative embodiments of the invention include constant impedance coaxial transitions 40, 80 configured to enable conversion to and from, for example, standard coaxial geometry, scaled to other standard RF power transmission line connectors.

The stripline section 60 includes, for example, a rectangular cross-section center conductor that is centered between two ground planes. The rectangular cross-section center conductor refers in this embodiment to first and second center conductors 100, 140 in the region between coax-to-stripline transition 50 and stripline-to-coax transition 70. This includes inner choke joint 180, which includes parts from the first and second center conductors 100, 140. Such parts include flat inner finger 210 and flat outer fingers 220 and 230. Ground planes refers in this embodiment of the invention to conducting joint bodies 120, 160 in the region between coax-to-stripline transition 50 and stripline-to-coax transition 70. This includes first and second outer choke joints 190, 200. Such outer choke joints include parts from conducting joint bodies 120, 160.

For example, the rectangular cross-section center conductor is sufficiently thick, so that an interdigital structure is optionally built inside to create significant overlap between a first center conductor 100 and a second conductor 140. The ground planes are significantly wider than the rectangular cross-section center conductor, as shown by way of example in FIG. 3, due to standard stripline geometry dimensions, so that they permit significant overlap with even a single set of overlapping planes (e.g., second outer plane 260 and second inner plane 270, or first outer plane 240 and first inner plane 250). However, it will be apparent to one of ordinary skill in the art that another embodiment of the invention includes sufficiently thick ground planes to construct interdigital structures inside, similar to the rectangular cross-section center conductor. The interdigitated structure of the rectangular cross-section center conductor and overlap of the conducting joint bodies 120, 160 is constructed to not inherently change the basic geometry of the stripline structure, allowing a relatively simple design. Optionally, an open (i.e., dielectric-free) stripline is chosen primarily to minimize mechanical and multipactor design complexity, but also to minimize weight and RF losses.

The constant impedance coaxial transitions 40, 80, which convert, for example, from a standard TNC connector interface to a coaxial geometry that matches well to the stripline section, are dielectric-loaded to prevent multipactor and also to provide support and positioning for the center conductor in the stripline section, and are nominally based on a constant-impedance taper. The clamp-up during assembly locates and centers everything, while allowing for post-assembly adjustment of the center conductor rotation.

The RF translational joint 20 operates essentially as two coax-to-stripline transitions 50, 70 in a back-to-back configuration with a structure in the center that mechanically separates the ground planes and the center conductor each into two pieces, allowing longitudinal or rotational motion in the plane of the stripline. By interrupting each ground plane (i.e., first outer choke joint 190 and second outer choke joint 200) with a thin gap made by overlapping large, thin plates, a large capacitor is formed that has no mechanical contact, is open-circuited at low frequencies, and allows signification in-plane motion and good RF performance in the frequency-range of interest.

Similarly, by interrupting the first center conductor (i.e., the first outer finger 220 and the second outer finger 230) with an interdigitated structure (i.e., inner finger 210) of the second center conductor 140, another capacitor is formed. In this case, however, the overlapping length of the interdigitated structure is chosen to be approximately one quarter-wavelength long for best match at the expected main frequency of interest, and then the geometry of the interdigitated structure is optimized in a standard manner to maximize the low-frequency extension and the overall bandwidth of the RF translational joint 20. Again, this interdigitated structure has no mechanical contact, is open-circuited at low frequencies and allows significant in-plane motion, and has good RF performance in the frequency-range of interest.

The dimensions of the stripline section 60 are chosen to maintain a characteristic impedance, for example, of 50 Ohms through the structure while preventing multipactor discharge in the RF power range of interest, with, for example, at least 6 dB of calculated margin over the full operating frequency range of the joint. Additionally, the center conductor accommodates a structure that provides sufficient capacitance, and the ground planes minimize radiation without growing too large.

Although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

As used herein, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

These and other implementations are within the scope of the following claims.

What is claimed as new and desired to be protected by Letters Patent of the United States is:

1. An apparatus comprising:
   a radio frequency translational joint comprising:
      a first initial coaxial line;
      a first constant impedance coaxial transition connected to the said first initial coaxial line;
      a coax-to-stripline transition;
      a stripline section connected to said first constant impedance coaxial transition via said coax-to-stripline transition;
      a stripline-to-coax transition;
      a second constant impedance coaxial transition connected to said stripline section via said stripline-to-coax transition; and
      a second initial coaxial line connected to said second constant impedance coaxial transition.

2. The apparatus according to claim 1, further comprising:
   a thrust stand comprising said radio frequency translational joint.

3. The apparatus according to claim 2, further comprising:
   a thruster located on said thrust stand, said thruster communicating with said radio frequency translational joint and, in operation, receiving power transmission via said radio frequency translational joint.

4. The apparatus according to claim 1, wherein said first initial coaxial line, said first constant impedance coaxial transition, and said stripline section together comprise:
   a first center conductor;
   a first insulator surrounding said first center conductor; and
   a first conducting joint body surrounding said first insulator.

5. The apparatus according to claim 4, wherein said first center conductor widens in at least part of said first constant impedance coaxial transition,
   wherein said first insulator widens in at least part of said first constant impedance coaxial transition.

6. The apparatus according to claim 4, wherein said first initial coaxial line comprises:
   a first coaxial connector surrounding said first center conductor and said first insulator, said first coaxial connector abutting said first conducting joint body.

7. The apparatus according to claim 4, wherein said stripline section, said second constant impedance coaxial transition, and said second initial coaxial line together comprise:
   a second center conductor;
   a second insulator surrounding said second center conductor; and
   a second conducting joint body surrounding said second insulator.

8. The apparatus according to claim 7, wherein said second center conductor widens in at least part of said second constant impedance coaxial transition,
wherein said second insulator widens in at least part of said second constant impedance coaxial transition.

9. The apparatus according to claim 7, wherein said second initial coaxial line comprises:
a second coaxial connector surrounding said second center conductor and said second insulator, said second coaxial connector abutting said second conducting joint body.

10. The apparatus according to claim 7, wherein said stripline section comprises:
an inner choke joint;
a first outer choke joint; and
a second outer choke joint, said first outer choke joint and said second outer choke joint being on respective sides of said inner choke joint.

11. The apparatus according to claim 10, wherein said inner choke joint comprises:
a flat inner finger, said second center conductor comprising said flat inner finger; and
a plurality of flat outer fingers, said first center conductor comprising said plurality of flat outer fingers.

12. The apparatus according to claim 10, wherein said first outer choke joint comprises:
a first outer plane, said first joint body comprising said first outer plane; and
a first inner plane, said second joint body comprising said first inner plane.

13. The apparatus according to claim 10, wherein said second outer choke joint comprises:
a second outer plane, said first joint body comprising said second outer plane; and
a second inner plane, said second joint body comprising said second inner plane.

* * * * *